United States Patent [19]

Pastor et al.

[11] 4,409,260

[45] * Oct. 11, 1983

[54] PROCESS FOR LOW-TEMPERATURE SURFACE LAYER OXIDATION OF A SEMICONDUCTOR SUBSTRATE

[75] Inventors: Ricardo C. Pastor, Manhattan Beach; Remedios K. Chew, Long Beach; Luisa E. Gorre, Oxnard, all of Calif.

[73] Assignee: Hughes Aircraft Company, El Segundo, Calif.

[*] Notice: The portion of the term of this patent subsequent to May 12, 1998 has been disclaimed.

[21] Appl. No.: 392,499

[22] Filed: Jun. 28, 1982

Related U.S. Application Data

[63] Continuation-in-part of Ser. No. 230,243, Feb. 21, 1981, abandoned, which is a continuation of Ser. No. 66,606, Aug. 15, 1979, Pat. No. 4,267,205.

[51] Int. Cl.$^3$ .......................................... H01L 21/316
[52] U.S. Cl. ........................................ 427/82; 357/52; 427/93
[58] Field of Search ........................ 427/82, 93; 357/52

[56] References Cited

U.S. PATENT DOCUMENTS

| | | | |
|---|---|---|---|
| Re. 28,385 | 4/1975 | Mayer | 427/399 |
| 2,802,760 | 8/1957 | Derick | 148/1.5 |
| 3,692,571 | 9/1972 | Colton et al. | 427/93 |
| 4,109,030 | 8/1978 | Briska et al. | 427/93 |
| 4,139,658 | 2/1979 | Cohen et al. | 427/93 |
| 4,176,206 | 11/1979 | Inoue | 427/82 |
| 4,232,057 | 11/1980 | Ray | 427/39 |
| 4,267,205 | 5/1981 | Pastor et al. | 427/93 |

FOREIGN PATENT DOCUMENTS 1521950 7/1971 Fed. Rep. of Germany ........ 427/93

OTHER PUBLICATIONS

Tressler et al., "Gas Phase Composition Considerations in the Thermel Oxidation of Silicon in Cl-H-O Ambients" J. Electrochem. Soc.: Solid State Science and Technology, Apr. 1977, vol. 124, No. 4.
Rosencher et al., "An $^{18}O$ Study of Thermal Oxidation of Silicon in Oxygen" App. Phys. Lett. 34, (4), Feb. 15, 1979, pp. 254–256.

Primary Examiner—John D. Smith
Attorney, Agent, or Firm—Mary E. Lachman; W. J. Bethurum; A. W. Karambelas

[57] ABSTRACT

The specification discloses a process for forming a coherent, uniform oxide layer on the surface of a selected semiconductor material by heating a wafer of the selected semiconductor material at a temperature of about 750° C. or lower in the presence of a chosen oxygen-containing precursor and a chosen gas phase halogen-containing molecular reactant which reacts with the oxygen-containing precursor to form atomic oxygen. The substrate is heated in the presence of these reactants for a period of time sufficient to enable the atomic oxygen to react with the surface atoms of the wafer and thus form the coherent uniform oxide layer. The temperature of about 750° C. is sufficiently low to avoid adverse effects, such as dopant migration, on the wafer. In a preferred embodiment of the present invention, a coherent, uniform layer of silicon dioxide is formed on the surface of a silicon wafer.

8 Claims, 1 Drawing Figure

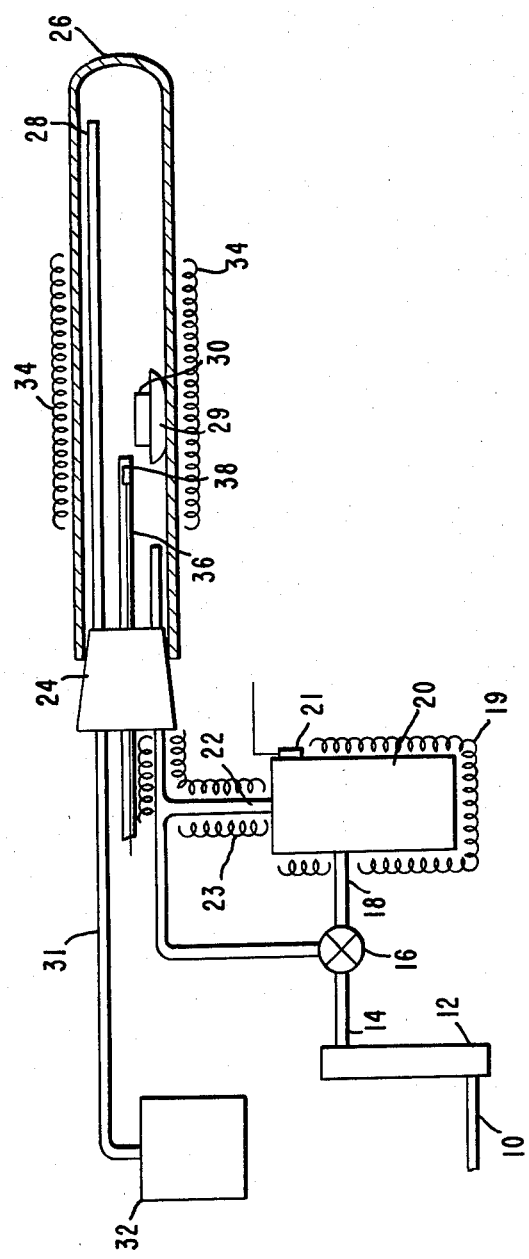

PROCESS FOR LOW-TEMPERATURE SURFACE LAYER OXIDATION OF A SEMICONDUCTOR SUBSTRATE

This is a continuation-in-part of patent application Ser. No. 230,243 filed Feb. 21, 1981, abandoned, which is a continuation of patent application Ser. No. 66,606, filed Aug. 15, 1979, issued as U.S. Pat. No. 4,267,205.

TECHNICAL FIELD

This invention relates generally to the manufacture of semiconductor devices and, more particularly, to a process for forming a coherent, uniform oxide layer on the surface of a selected semiconductor material.

BACKGROUND OF THE INVENTION

In the manufacture of semiconductor devices, an oxide layer is frequently used for masking during such procedures as etching, solid state diffusion, or ion-implantation, or as a passivation layer to permanently protect the surface of the substrate. These oxide layers are usually deposited by either liquid phase growth, vapor phase growth, controlled pyrolysis, or precipitation (i.e., polycrystalline deposit). A major disadvantage of the liquid phase deposition is that it is difficult to grow extremely uniform thin films over a large area, which is a feature that is highly desirable in certain solar cell and integrated circuit technologies. Vapor phase deposition can be accomplished by physical vapor deposition (PVD), such as sublimation, sputtering, flash evaporation, molecular beam epitaxy (MBE), and by chemical vapor deposition (CVD), which makes use of reactive intermediates. One disadvantage of physical vapor deposition is that it is impractical when incongruent volatilization occurs, as is the case for GaAs.

With the decrease in device dimensions required in advanced integrated circuit technologies, the need arises to exert a tighter control over diffusion profiles in order to maintain relatively small device geometries. This has led to the desire to perform device processing at lower temperatures in order to suppress the movement of dopants and achieve better control of device geometry. Various approaches to this problem in the case of silicon devices have performed processing at one atmosphere pressure but above 1000° C., or at 700° C. and compensated for the lower temperature by the use of high concentration of the gas-phase reactant ($H_2O$ or oxygen), i.e., at a high pressure. In particular, a substrate such as silicon may be treated with HCl and oxygen ($O_2$) or trichlorethylene and $O_2$ at one atmosphere pressure and at a temperature exceeding 1000° C., to form $SiO_2$, as described by R. E. Tressler, J. Stach, and D. M. Metz in the publication entitled "Gas Phase Composition Considerations in the Thermal Oxidation of Silicon in Cl-H-O Ambients," in the *Journal of the Electrochemical Society*, Vol. 124, No. 4, 1977, at page 607. A five hour treatment of silicon oriented along the (111) axis with ten percent HCl gas (g) in $O_2$ (g), as discussed by D. W. Hess and B. E. Deal in a publication entitled "Kinetics of the Thermal Oxidation of Silicon in $O_2$/HCl Mixtures," in the *Journal of the Electrochemical Society*, Vol. 124, No. 5, 1977, at page 735, resulted in oxide layer depositions of the following approximate thicknesses: 1000 angstroms at 900° C., 2000 angstroms at 1000° C., and 3000 angstroms at 1100° C.

In another approach to the problem of surface layer oxidation, water vapor has been used directly as the source of oxygen in the oxidation process, as described by E. A. Irene and R. Ghez, in the publication entitled "Silicon Oxidation Studies: The Role of $H_2O$," in the *Journal of the Electrochemical Society*, Vol. 124, No. 11, 1977, at page 1757. By the process of Irene and Ghez, an oxide layer 2000 angstroms thick was depositied on a silicon substrate by treatment at 893° C. for five hours with $N_2$ (g) containing 2000 parts per million $H_2O$ (g). It was also determined by Irene and Ghez that water vapor acts as an accelerator for the oxidation process. For example, treatment of a substrate with dry $O_2$ (g) at 893° C. for five hours resulted in the deposition of an oxide layer 500 angstroms thick, while treatment of the substrate with $O_2$ (g) containing 2000 parts per million $H_2O$ (g) under the same conditions resulted in the deposition of an oxide layer 700 angstroms thick. Further studies by E. A. Irene are reported in the publication entitled "The Effects of Trace Amounts of Water on the Thermal Oxidation of Silicon in Oxygen," in the *Journal of the Electrochemical Society*, Vol. 121, No. 12, 1974, at page 1613. In this latter work, an oxide layer 300 angstroms thick was formed by treating the substrate at 800° C. for five hours with $O_2$ (g) containing 25 parts per million $H_2O$ (g). In addition, Hideo Sunami, in the publication entitled "Thermal Oxidation of Phosphorus-doped Polycrystalline Silicon in Wet Oxygen," in the *Journal of the Electrochemical Society*, Vol. 125, No. 6, 1978, at page 892, reported that treatment of an undoped silicon substrate at 750° C. for five hours with $O_2$ (g) saturated with $H_2O$ (g) produced from $H_2O$ (liquid) at 90° C. resulted in the deposition of an oxide layer which was 70 angstroms thick, while treatment of a silicon substrate heavily doped with phosphorus ($2.2 \times 10^{21}$ cm$^{-3}$) under the same conditions resulted in the deposition of an oxide layer 500 angstroms thick.

Further, in the publication by Joseph Blanc, entitled "A Revised Model for the Oxidation of Si by Oxygen," in *Applied Physics Letters*, Vol. 33, No. 5, 1978, at page 424, it was reported that an excellent agreement was obtained with the experimental data on the oxidation of silicon by dry $O_2$ (g). This model proposes that diffusion through the amorphous oxide is via molecular oxygen, but silicon oxidation occurs through the reaction of a small concentration of atomic oxygen. This model indicates that treatment of a silicon substrate at 893° C. for five hours in dry $O_2$ (g) would deposit an oxide layer 500 angstroms thick.

Finally, L. E. Katz and L. C. Kimerling, in the publication entitled "Defect Formation During High Pressure, Low Temperature Steam Oxidation of Silicon," in the *Journal of the Electrochemical Society*, Vol. 125, No. 10, 1978, at page 1680, discussed the oxidation of silicon wafers with steam at a pressure of 300 pounds per square inch at 700° C. for various lengths of time (not stated). The thickness of the oxide layers ranged from 5000 angstroms to 55,000 angstroms. The defect-state concentration after high pressure steam oxidation was found to be nearly identical to the preoxidation condition, and this feature was attributed to the use of a low operating temperature.

While all of the above-mentioned methods have achieved surface layer oxidation at temperatures lower than those previously used in the art, none of these methods has, to our knowledge, been able to achieve a uniform and rapid oxidation rate at a temperature as low as 750° C. under a total pressure as low as one atmosphere.

SUMMARY OF THE INVENTION

One purpose of the present invention is to provide a new and improved process for forming a coherent and uniform layer on the surface of a selected semiconductor material at a temperature sufficiently low to provide improved control over diffusion profiles and device geometry.

In order to accomplish this purpose, we have discovered and developed a process for forming a coherent, uniform oxide layer on the surface of a selected semiconductor material by heating a wafer of the selected semiconductor material at a predetermined elevated temperature in an atmosphere conducive to the formation of atomic oxygen for a period of time sufficient to enable the atomic oxygen to react with the surface atoms of the wafer and thus form the coherent, uniform oxide layer. The predetermined elevated temperature is sufficiently low to avoid adverse effects on the wafer. In a preferred embodiment of the present invention, a coherent, uniform layer of silicon dioxide is formed on the surface of a silicon wafer at a temperature of 750° C. and one atmosphere of pressure.

Accordingly, it is an object of the present invention to provide a new and improved process for forming a coherent and uniform oxide layer on the surface of a semiconductor substrate at a temperature sufficiently low to provide improved control over diffusion profiles and thus improve control over resulting device geometries.

Another object of the present invention is to provide a process of the type described which is performed at one atmosphere of pressure.

Still another object is to provide a low-temperature, relatively rapid process for forming a surface oxide layer on a chosen substrate.

A feature of the present invention is that the process described herein is performed by controlled atmosphere processing.

The foregoing and other object, features, and advantages of the present invention will be apparent from the following more particular description of the preferred embodiment of the invention, as illustrated in the accompanying drawing.

BRIEF DESCRIPTION OF THE DRAWING

The FIGURE illustrates, in schematic form, a preferred apparatus for carrying out the process of the present invention.

DETAILED DESCRIPTION OF THE INVENTION

In the FIGURE there is shown, in schematic form, a preferred apparatus for carrying out one embodiment of the present invention. A carrier gas, such as He, is introduced through an inlet tube 10, made of Teflon, pyrex, or polyethylene, into a flowmeter 12, where the flow of the carrier gas is adjusted to a desired value, such as 1 cm$^3$/second. This carrier gas passes from the flowmeter 12 through a tube 14, made of Teflon, pyrex, or polyethylene, through a valve 16, and through a tube 18, also typically made of Teflon, pyrex, or polyethylene, into a pyrex chamber 20, which contains a mixture of $I_2$ (solid) suspended in $H_2O$ (liquid) that is kept just below 100° C. The carrier gas bubbles through the $I_2$-$H_2O$ mixture in the chamber 20 and serves to keep the $I_2$ dispersed in the $H_2O$. Enough $I_2$ must be used so that $I_2$ vapor is maintained above the $H_2O$ in the chamber 20 throughout the entire oxidation process of this invention. Under equilibrium conditions, the partial pressure of $H_2O$ is approximately 715 millimeters and the partial pressure of $I_2$ is approximately 45 millimeters.

The chamber 20 is heated to maintain the $H_2O$ just below 100° C. and this is accomplished by means of the heating elements 19 which surround the chamber 20. The resistance heating elements 19 may be made of Nichrome and are activated by applying a controlled voltage thereto. A thermocouple or a thermometer 21 is inserted between the outside wall of the chamber 20 and the heating elements 19 in order to monitor the temperature of the chamber 20. The gas mixture comprising $I_2$, $H_2O$ and the carrier gas is channeled through the Teflon or pyrex tubing 22, which is kept hot by the heating elements 23 which surround the tubing 22, to prevent crystallization of the $I_2$ (s). The resistance heating elements 23 may also be made of Nichrome and are activated by applying a controlled voltage thereto. The temperature in the tubing 22 must be maintained higher than the temperature in the chamber 20 in order to maintain the $I_2$ in the vapor state. The gas mixture of $I_2$, $H_2O$ and the carrier gas passes from the tubing 22, through a cap 24 that is made of Teflon or vitreous silica and finally enters a reaction tube 26 which is made of high purity (99.99%) alumina or vitreous silica.

The reaction tube 26 contains the semiconductor wafer 30 to be processed, which is held in an alumina or vitreous silica boat 29. The reaction tube 26 is provided with a thermocouple 38 which is contained in a well formed by the alumina or vitreous silica tubing 36 which enters the reaction tube 26 through the cap 24. The thermocouple 38 is placed in close proximity to the semiconductor substrate 30 and is used to monitor the temperature in the reaction chamber 26.

The reaction tube 26 is also provided with an alumina or vitreous silica tubing 28 through which gas reactants exit from the reaction tube 26, then pass through an exit tube 31 which is typically made of Teflon, pyrex, or polyethylene, and ultimately enter a pyrex chamber 32, where excess iodine is solidified as it cools to room temperature and is trapped. From the chamber 32, the gas mixture passes to a scrubber (not shown) so that any uncondensed $I_2$ may be removed before the exhaust gas is released to the surrounding atmosphere.

The central section of the reaction tube 26 is provided with selected heating elements 34 which are used to heat the central section of the reaction tube 26 to a predetermined elevated temperature, typically 750° C. for a silicon substrate. The temperature to which the reaction tube 26 is heated, depends on the material of which the substrate is formed and must be a temperature that is sufficiently low so that the substrate will not be damaged and yet sufficiently high to produce the required atomic oxygen. The heating elements 34 may be made of Nichrome and are activated by the application of a controlled voltage thereto.

The gas flow control valve 16 is used to bypass the chamber 20 during cool-down after completion of wafer processing; and the carrier gas can then remove any remaining $I_2$ from the apparatus tubing and from the reaction chamber 26.

In practicing the process of the present invention, the above-described apparatus of the figure is used as follows. The selected substrate 30 is placed in the alumina boat 29. The substrate 30 comprises a selected semiconductor material, such as silicon or germanium, or an elemental material, such as aluminum, indium, iron, tin, titanium, or tantalum, which is capable of surface oxidation to form the oxide thereof and which is capable of withstanding the processing temperature specified herein (e.g., about 750° C. or less) without suffering degradation. The boat 29 and the substrate 30 are placed in the reaction tube 26, which is sealed with the cap 24. In one embodiment of the present invention, predetermined amounts of iodine and water are placed in the chamber 20. The heating elements 19, 23, and 34 are activated by the application of a controlled voltage thereto. The helium carrier gas is introduced through the tube 10 to the flowmeter 12, which adjusts the flow to a predetermined rate, and the helium then passes through the tube 14, the valve 16, and the tube 18 and into the chamber 20. The vapor mixture of $I_2$, $H_2O$, and He formed in the chamber 20 then passes through the heated tube 22 and finally enters the reaction tube 26.

The temperature in the reaction tube 26 is maintained at a predetermined elevated temperature of about 750° C. or lower, which is sufficiently high so as to produce the desired chemical reaction to provide atomic oxygen, as discussed in greater detail below, while at the same time sufficiently low so as to minimize adverse thermal damage to the substrate. At the temperature of about 750° C. in the reaction tube 26, the vapor mixture of iodine and water undergoes a chemical reaction to generate atomic oxygen, which then reacts with the substrate, such as silicon, to form the oxide thereof. The temperature of the reaction depends, of course, on the particular reactants used to generate the required atomic oxygen.

While not limiting the present invention to any particular theory of operation, it is believed that the probable mechanism for these reactions is as shown in Equations (1) through (4) and discussed in greater detail below.

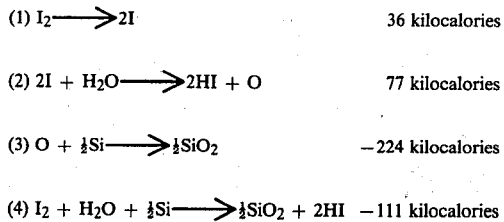

In the first step, atomic iodine is produced from molecular iodine as indicated in Equation (1), by the application of heat. It is relatively easy to generate atomic iodine from $I_2$ thermally since the energy required to break the bond in $I_2$ is 36 kilocalories (Kcal), as set forth in the book entitled "Bond Energies, Ionization Potentials, and Electron Affinities," by V. I. Vedeneyev et al., St. Martin's Press, New York, 1966. At 750° C., such as the process of the present invention, about three out of a hundred of the $I_2$ molecules are dissociated, which provides an acceptable rate of reaction as discussed in greater detail below.

Next, the atomic iodine reacts with the oxygen-containing precursor to release atomic oxygen as shown in Equation (2) above. In order to break the O—H bond in $H_2O$, as shown in Equation (2), energy is needed. This energy is provided by the formation of HI from the H component of OH as shown in Equation (2) and $SiO_2$ from the O component as shown in Equation (3), which releases energy. The net energy input requirement for Equation (2) has been calculated as described below to be 77 kilocalories. However, the atomic oxygen formed by Equation (2) reacts with the surface atoms of the silicon substrate to form $SiO_2$ as shown in Equation (3) above, releasing energy to more than offset the requirements of Equations (1) and (2). The net reaction of coupling, the sum of Equations (1), (2), and (3) is shown in Equation (4) above and shows the release of a considerable amount of energy (i.e., 111 kilocalories). The latter is to be contrasted with some prior art processes previously discussed, in which a large input of thermal energy (119 kilocalories) is required in order to break the O—O bond in molecular oxygen and necessitates the use of temperatures in excess of 1000° C.

The net energy input requirement for Equation (2) was calculated by breaking the reaction down into its component parts as shown in Equations (5), (6), and (7) below and determining the dissociation energy for each component part by reference to the table provided in Vedeneyev et al. previously cited. The summation of Equations (5), (6), and (7) below provides Equation (2) above, and shows the requirement for an energy input of approximately 77 kilocalories.

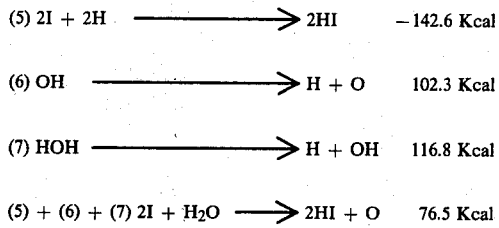

In a similar manner, in accordance with the process of the present invention, the required atomic oxygen may be generated by a vapor phase reaction at elevated temperatures of about 750° C. or less, between a selected oxygen-containing precursor and a selected gas phase halogen-containing molecular reactant capable of reacting with the precursor to dissociate off or release atomic oxygen. Other oxygen-containing precursors besides water which may be used include hydrogen peroxide ($H_2O_2$), nitrous oxide ($N_2O$), and nitrogen dioxide ($NO_2$). Other gas phase halogen-containing molecular reactants which may be used include halogen compounds such as $X_2$ or $CX_4$, which react with water, for example, and from which an atomic halogen species may be generated, as discussed in the publication entitled, "Crystal Growth in a Reactive Atmosphere," by R. C. Pastor and A. C. Pastor in the *Materials Research Bulletin*, Vol. 10, 1975, pages 117 to 124. Such halogen compounds include $Cl_2$, $Br_2$, $I_2$, $CF_4$, $CCl_4$ $CHCl_3$, $CBr_4$, $CHBr_3$, $CI_4$ and $CHI_3$. The criteria for the gas phase halogen-containing molecular reactant are that it be capable of reacting with the oxygen-containing precursor to generate atomic oxygen, and that the energy input requirement for such a reaction can be achieved by heating the reactants to a temperature as low as approximately 750° C. so as to avoid thermal damage to the substrate. In order to determine whether a selected halogen-containing reactant and a chosen oxygen-containing precursor would be suitable for accomplishing the process of the present invention, a detailed analysis of the thermodynamics and kinetics of the reactions involved can be performed as follows.

Considering, in particular, possible oxygen-containing precursors, the oxides of nitrogen ($N_2O$, $NO$, and $NO_2$) are potential sources of atomic oxygen (O) because, compared to $H_2O$ previously discussed, they are high free-energy ($\Delta F$) molecules, e.g., at 298° K. (or 25° C.), $\Delta F°_{298}$ is $+24,7000$ cal for $N_2O$, $+20,700$ cal for $NO$, and $+12,400$ cal for $NO_2$, while $H_2O$ is $-56,720$ cal. The higher the free-energy content, the more unstable is the molecule towards decomposition into the elements. In the discussion that follows, a temperature of 1000° K. (or 727° C.) is adopted as the reference temperature for processing.

In the case of nitrous oxide ($N_2O$), a high concentration in the gas phase is not desired since such conditions favor a bimolecular decomposition to produce oxygen in the molecular form, as shown in Equation (8) below.

$$N_2O + N_2O \rightarrow 2N_2 + O_2 (\Delta F_{1000} = -74,100 \text{ cal}) \tag{8}$$

To favor atomic oxygen (O) production, the decomposition should: (a) be unimolecular, as shown in Equation (9) below; (b) be conducted in a manner to favor collision with the Si substrate to consume O, as shown in Equation (10) below; and (c) minimize collision of O and $N_2O$ in the gas phase which consumes atomic oxygen in a side reaction, as shown in Equation (11) below.

(9) $N_2O \longrightarrow N_2 + O$  ($\Delta F_{1000} = +26,225$ cal)

(10) $O + \tfrac{1}{2}Si \longrightarrow \tfrac{1}{2}SiO_2$  ($\Delta F_{1000} = -125,075$ cal)

(11) $O + N_2O \longrightarrow O_2 + N_2$  ($\Delta F_{1000} = -63,525$ cal)

From the value of $\Delta F_{1000}$ of Equation (9), a low thermodynamic yield results. Hence, an equilibrium situation is not the object. This means that the O produced by Equation (9) must be readily consumed by Equation (10). Therefore, the more important issue is the kinetic feasibility of Equation (9). It should be noted that the overall equilibrium process, represented by the sum of Equations (9) and (10) is favored thermodynamically with $\Delta F_{1000} = -98,850$ cal.

From the data of Vedeneyev et al., previously referenced, the specific decomposition rate (k) by Equation (9) is represented by Equation (12).

$$k = \nu e^{-\frac{38,700 + RT}{RT}} \tag{12}$$

where
$\nu$ = vibrational frequency
R = gas constant = 1.986 cal deg$^{-1}$ mol$^{-1}$
T = temperature (°K.)
38,700 = bond dissociation energy at 0° K. to release O from $N_2O$ (in calories).
Taking a typical value for the vibration frequency of light molecules of $\nu \approx 10^{13}$ sec$^{-1}$, it follows from Equation (12) that at T = 1000° K. the value of k is $1.27 \times 10^4$ sec$^{-1}$. This value of k means that, on the average, it takes a molecule of $N_2O$ about 80 microseconds to decompose by Equation (9). Thus, in principle, $N_2O$ may be used as a source of O without the use of an atomic halogen (X) as a catalyst. However, $N_2O$ (g) should be diluted with He to discourage the occurrence of the reactions of Equations (8) and (11).

Turning next to nitric oxide (NO) as a possible oxygen-containing precursor for the process of the present invention, NO is a high free-energy molecule, as noted above. Hence, the bimolecular mode of decomposition shown in Equation (13) is highly favored thermodynamically.

$$NO + NO \rightarrow N_2 + O_2 (\Delta F_{1000} = -37,300 \text{ cal}) \tag{13}$$

The decomposition of NO (g) diluted with He would favor the unimolecular mode of decomposition shown in Equation (14).

$$NO \rightarrow N + O (\Delta F_{1000} = 124,735 \text{ cal}) \tag{14}$$

The process should not be designed to approximate equilibrium because the thermodynamic yield of Equation (14) is extremely low. Yet the overall equilibrium process, represented by the sum of Equations (10) and (14) and the associated reaction of $2N \rightarrow N_2$ (not shown) is thermodynamically favored with a $\Delta F_{1000} = -98,850$ cal.

The atomic nitrogen (N) produced by Equation (14) can further generate O by reaction with NO, as shown in Equation (15).

$$N + NO \rightarrow N_2 + O (\Delta F_{1000} = -72,285 \text{ cal}) \tag{15}$$

Fortunately, the complementary reaction with O to form N, as shown in Equation (16), is not favored.

$$O + NO \rightarrow O_2 + N (\Delta F_{1000} = +34,985 \text{ cal}) \tag{16}$$

From the data of Vedeneyev et al., the specific decomposition rate (k) by Equation (14) is represented by Equation (17).

$$k = \nu e^{-\frac{150,000 + RT}{RT}} \tag{17}$$

where 150,000 = bond dissociation energy at 0° K. to release O from NO (in calories)
Again, taking $\nu \approx 10^{13}$ sec$^{-1}$, it follows at T = 1000° K. that $k = 5.9 \times 10^{-21}$ sec$^{-1}$. The latter value of k means that the forward progress of Equation (14) at T = 1000° K. is also kinetically implausible because the mean lifetime of the NO molecule is $5.4 \times 10^{12}$ years. Thus, NO is not a suitable oxygen-containing precursor for the process of the present invention.

Considering next nitrogen dioxide ($NO_2$) as a possible oxygen-containing precursor in the process of the present invention, since $NO_2$ is a high free-energy molecule, the bimolecular decomposition is highly favored thermodynamically, as shown in Equation (8).

$$NO_2 + NO_2 \rightarrow N_2 + 2O_2 (\Delta F_{1000} = -45,700 \text{ cal}) \tag{18}$$

Dilution in the gas phase favors unimolecular breakdown, shown in Equation (19).

$$NO_2 \rightarrow NO + O (\Delta F_{1000} = +40,675 \text{ cal}) \tag{19}$$

This reaction cannot operate in an equilibrium manner since the forward displacement of Equation (19) is thermodynamically unfavored. However, as long as the efficient sinking of O produced by Equation (19) can be produced through its consumption by the reaction of Equation (10), then the only matter of interest is the kinetic feasibility for the forward progress of Equation (19). It should be noted that the overall equilibrium process represented by the sum of the Equations (10) and (19) is thermodynamically favored with a $\Delta F_{1000} = -84,400$ cal. From the data of Vedeneyev et al., the specific decomposition rate (k) for Equation (19) is represented by Equation (20).

$$k = \nu e^{-\frac{71,800 + RT}{RT}} \qquad (20)$$

where 71,800 = bond dissociation energy at 0° K. to release O from $NO_2$ (in calories)

From a value of $\nu \approx 10^{13}$ sec$^{-1}$, then at T = 1000° K. the value of k is $7.37 \times 10^{-4}$ sec$^{-1}$. If the occurrence of Equation (19) is managed in an irreversible fashion, half of the $NO_2$ population will break down by Equation (19) in about 16 minutes. Thus, $NO_2$ alone would be suitable for generating the atomic oxygen required in the process of the present invention.

For the feasibility of an even faster response, consider the use of an atomic halogen (X) as a catalyst to the reaction of Equation (19), by the reactions shown in Equations (21a) and (21b) below.

$$NO_2 + X \rightarrow NOX + O \qquad (21a)$$

$$NOX \rightarrow NO + X \qquad (21b)$$

Note that the sum of Equations (21a) and (21b) equals Equation (19). The progress of Equation (21a), the reaction which produces O, is dependent on the regeneration of X. (It is assumed that the radical reaction of Equation (21a) occurs rapidly.) The regeneration of X comes about by Equation (21b), i.e., the breakdown of NOX, which should occur easily. This conclusion is supported by the date of Vedeneyev et al., on page 82, where the energy required for the bond-breaking to release X is 57 Kcal for NOF, 37 Kcal for NOCl, and 28 Kcal for NOBr. Thus, even NOI will easily split off I.

The forward progress of Equation (21a) depends on: (a) the extent of the energy climb (measured by $\Delta F_{1000}$); and (b) the steady-state concentration of X (measured by the dissociation of $X_2$). The value of $\Delta F_{1000}$ for Equation (21a) is +30,263 cal for X=Cl, +39,027 cal for X=Br, and +46,439 cal for X=I. While the case of X=Cl has the lowest uphill climb in energy, only a small amount of Cl is produced by the dissociation of $Cl_2$: 35 out of $10^5$ molecules are dissociated at one atmosphere, as discussed below. On the other hand, the concentration of I is about two orders of magnitude higher since 28 out of $10^3$ molecules of $I_2$ are dissociated at 1 atmosphere. However, the case using I has the highest uphill climb. Consequently, the intermediate case of X=Br, where 23 $Br_2$ molecules out of $10^4$ are dissociated at 1 atmosphere, would seem to offer the better compromise.

The case of X=Br for Equation (21b) shows kinetic feasibility in maintaining the concentration of X. From the data of Vedeneyev et al., the specific decomposition rate (k) of X=Br for Equation (21b) is represented in Equation (22).

$$k = \nu e^{-\frac{28,000 + R(T-298)}{RT}} \qquad (22)$$

where
28,000 = bond dissociation energy to release X from NOX

T-298 = value of Vedeneyev adjusted from room temperature to 0° C.

Taking a typical value of $\nu \approx 10^{13}$ sec$^{-1}$, then at T = 1000° K. the value of k is $3.74 \times 10^6$ sec$^{-1}$. The latter value of k means that the average lifetime of NOBr at 1000° K. is 0.27 microseconds, which means that the desired X is regenerated rapidly.

Thus, a reaction using $NO_2$ as the oxygen-containing precursor and bromine ($Br_2$) as the gas phase halogen-containing molecular reactant can be used to generate the atomic oxygen required in the process of the present invention.

The steady state concentration of X discussed above is determined as follows for the dissociation reaction by which atomic halogen is generated as shown in Equation (23).

$$X_2 \rightleftharpoons 2X \qquad (23)$$

The equilibrium constant ($K_p$) at constant pressure for Equation (23) was derived from the dissociation data of Table 104, page 773 of Vol. I of H. Remy's "Treatise on Inorganic Chemistry," edited by J. Kleinberg, Elsevier, 1956. The equilibrium constant for $X_2 = Cl_2$ is shown in Equation (24), while that for $I_2$ is shown in Equation (25).

$$\ln K_p = -\frac{2.9845 \times 10^4}{T} + 15.3163 \qquad (24)$$

where
ln = natural log $$2.9845 \times 10^4 = \frac{\text{calculated energy needed to break Cl—Cl bond}}{R}$$

15.3163 = reference value of $K_p$ characteristic of $Cl_2$ $$\ln K_p = -\frac{1.7086 \times 10^4}{T} + 11.322 \qquad (25)$$

where $$1.7086 \times 10^4 = \frac{\text{calculated energy needed to break I—I bond}}{R}$$

11.322 = reference value of $K_p$ characteristic of $I_2$.

The degree of dissociation ($\alpha$) of $X_2$ is related to $K_p$ as shown in Equation (26).

$$K_p = \frac{4\alpha^2}{1 - \alpha^2} P \qquad (25)$$

where P = total pressure

At P = 1 atmosphere and T = 1000° K., and as calculated from Equation (26), $\alpha = 3.5 \times 10^{-4}$ for $X_2 = Cl_2$ and $\alpha = 2.8 \times 10^{-2}$ for $X_2 = I_2$. In other words, 35 out of 100,000 molecules are dissociated in the case of $Cl_2$ and 28 molecules out of 1000 in the case of $I_2$ at 1 atmosphere and 1000° K. Thus, there are $10^2$ times as many $I_2$ molecules dissociated as $Cl_2$ molecules.

The importance of the steady state concentration of X is that the latter determines the forward progress of the reaction by which atomic oxygen is generated from the oxygen-containing precursor as shown in Equation (27).

$$2X + H_2O \rightarrow 2HX + O \qquad (27)$$

Since the rate of a reaction is proportional to the concentration of the active molecules, the forward progress of Equation (27), i.e., the formation of O, depends on the square of the concentration of X. It may be assumed that the reaction of Equation (27) is the slowest step in the process. (Once O is available, it is known that O readily attacks the Si substrate to form $SiO_2$. Therefore, the bottleneck in the reaction sequence of the process is the formation of O.) Consequently, with other experimental conditions held constant, Equation (27) based on $X = I$ will proceed about $10^4$ times faster than in the case of $X = Cl$. Since, in the case of iodine, the extent of the reaction desired, i.e., the thickness of the $SiO_2$ layer on the Si substrate, has been experimentally determined to require a period on the order of 10 hours, the factor of $10^4$ renders the use of chlorine impractical. On the other hand, as previously discussed, the steady state concentration and uphill climb for the case where $X = Br$ is such that $Br_2$ would be a suitable halogen-containing molecular reactant for the process of the present invention.

By the process of the present invention, a high quality surface oxide layer can be deposited at a temperature which is sufficiently low to provide improved control over diffusion profiles. By suppressing the unacceptable movement of dopants and avoiding this adverse effect, the process of the present invention thus achieves a better control of semiconductor device geometry than was previously attainable by some prior art processes described above. In addition, the present invention has the added advantage that processing is performed at one atmosphere of pressure, thus eliminating the need for complex and costly vacuum apparatus. Furthermore, by the process of the present invention, a layer of $SiO_2$ can be deposited at a significantly faster rate than the prior art processes discussed above. By using a low temperature for the oxidation of silicon, the present invention is also able to avoid defect states (stacking faults) which normally occur at the interface of the silicon wafer with the oxide when the oxide is formed at a high temperature.

The process of the present invention is useful for forming a native oxide passivation or insulation layer on the surface of a semiconductor substrate in the fabrication of semiconductor devices and integrated circuits.

EXAMPLE

This example illustrates the use of the apparatus described in the FIGURE in order to carry out one process embodiment of the present invention. The following procedure was performed separately on a silicon wafer which was undoped and on a silicon wafer which was doped with indium to a level of 1.5 to $2.0 \times 10^{17}$ atoms per $cm^3$. The silicon wafer 30 to be processed, having dimensions of 1 centimeter by 1 centimeter, was placed in the alumina boat 29 and then the boat 29 and the wafer 30 were placed in the reaction tube 26, which had a volume of 1600 $cm^3$, so that the wafer was 15 inches from the opening of the tubing 22 which entered the reaction tube 26 through the cap 24. The cap 24 was placed in the opening of the reaction tube 26 in the position shown in the FIGURE. Twenty grams of $I_2$ (s) and 40 grams of water were placed in the chamber 20. The heating elements 19 and 23 were activated by the application of a controlled voltage thereto. The heating elements 34, which were made of Nichrome, surrounding twelve inches of the central section of the reaction tube 26, were activated by applying a controlled voltage thereto, and the temperature in the reaction tube 26 was raised to 750° C., as monitored by the thermocouple 38.

Helium carrier gas was then introduced through the tube 10 to the flowmeter 12, which adjusted the flow of helium to 1 $cm^3$/second. The helium then passed through the tube 14, through the valve 16, and through the tube 18 into the chamber 20 whch contained the mixture of $I_2$(s) and $H_2O$ (liquid) which was kept just below 100° C. by the heating elements 19, as monitored by the thermocouple 21. The $I_2$, $H_2O$, He gas mixture then passed through the tube 22, which was heated by the heating elements 23 in order to prevent crystallization of $I_2$ (s), and finally entered the reaction tube 26. These reaction conditions were maintained for a period of five hours. During processing, gas reactants passed out of the reaction tube 26 through the alumina tubing 28 to the exit tubing 31, and then to the chamber 32, where excess iodine was solidified and trapped. After processing had been completed, the heating elements 19, 23 and 34 were deactivated by removal of the applied voltage. The valve 16 was then adjusted so that the chamber 20 was by-passed during cool-down in order that the helium gas could remove $I_2$ vapor from the apparatus.

By processing a silicon wafer as just described for a period of five hours at atmospheric pressure, an oxide layer deposit, which was predominantly $SiO_2$, was formed on the surface of the silicon wafer to a thickness of 1500 angstroms. The oxide layer so formed was found to be uniform, coherent, and strongly adherent by virtue of being chemically bonded at the interface with the substrate.

By processing a silicon wafer as just described for a period of five hours at 750° C., except that oxygen was used as the carrier gas, a layer of $SiO_2$ having a thickness of $1150 \pm 50$ Å was formed. By processing a silicon wafer as just described for five hours at 750° C., except that nitrous oxide was used as the carrier gas, a layer of $SiO_2$ having a thickness of 550 Å was formed.

While the present invention has been particularly described with respect to the preferred embodiments thereof, it will be recognized by those skilled in the art that certain modifications in form and detail may be made without departing from the spirit and scope of the invention. In particular, the scope of the invention is not limited to the silicon substrate described herein, but is intended to include other semiconductor substrates, as well as selected elemental substrates, which are capable of surface oxidation and which are capable of withstanding the elevated temperatures required to produce the atomic oxygen used in the present invention. In addition, the scope of the present invention is not limited to processing which uses iodine and water, as described herein, but is intended to include the use of any gas phase molecular reactant that can react with an oxygen-containing precursor to dissociate off atomic oxygen at an elevated temperature which does not adversely affect the selected substrate. Moreover, the atomic oxygen required in the process of the present invention may be generated directly from the oxygen-containing precursor without the use of a gas phase molecular reactant, as in the case of nitrogen dioxide described herein. It is also intended to include within the scope of the present invention the use of other carrier gases besides helium, such as oxygen, nitrogen, or carbon dioxide. Furthermore, the apparatus described in relation to the FIGURE may be adapted to accommodate these various atomic oxygen-producing mixtures of oxygen precursor and halogen compound. In addition, the apparatus for carrying out the present invention is not limited to the particular configuration described herein, but includes such modifications as may be apparent to one skilled in the semiconductor materials arts and particularly in the art of producing oxide layers. Finally, the present invention is not limited to the specific process conditions specified herein in one preferred embodiment of the present invention using iodine and water as the reactants. Rather, the process conditions may be adjusted as required for the particular reactants used and for the particular substrate being oxidized.

What is claimed is:

1. A process for forming a coherent, uniform oxide layer on the surface of a selected semiconductor material which comprises:
   (a) providing a wafer of said semiconductor material; and
   (b) heating said wafer to a temperature of about 750° C. or lower in the presence of a selected oxygen-containing precursor and a chosen gas phase halogen-containing molecular reactant capable of reacting with said oxygen-containing precursor at said temperature to form atomic oxygen, for a period of time sufficient to enable said atomic oxygen to react with the surface atoms of said wafer and thereby form said coherent, uniform oxide layer, said temperature being sufficiently low to avoid adverse effects on said wafer.

2. The process as set forth in claim 1 wherein said semiconductor material is selected from the group consisting of silicon, germanium, and an oxidizable semiconductor material capable of withstanding said temperature of about 750° C. or lower.

3. The process as set forth in claim 1 wherein said wafer is doped with impurities to a predetermined concentration and in a predetermined profile, whereby said temperature is sufficiently low to suppress movement of said dopants in said semiconductor material.

4. The process set forth in claim 1 wherein said oxygen-containing precursor is selected from the group consisting of water ($H_2O$), hydrogen peroxide ($H_2O_2$), nitrous oxide ($N_2O$), and nitrogen dioxide ($NO_2$).

5. The process set forth in claim 1 wherein said gas phase halogen-containing molecular reactant is selected from the group consisting of $Cl_2$, $Br_2$, $I_2$, $CF_4$, $CCl_4$, $CHCl_3$, $CBr_4$, $CHBr_3$, $CI_4$ and $CHI_3$.

6. A process for forming an oxide layer on a chosen semiconductor substrate which comprises exposing a surface of said substrate at a temperature of about 750° C. to a mixture of a selected oxygen-containing precursor and a gas phase halogen-containing molecular reactant which is capable of being dissociated by heat to produce atomic halogen that reacts with said oxygen-containing precursor to dissociate off atomic oxygen at said temperature which does not adversely affect said chosen semiconductor substrate, to thereby form said oxide layer on said surface of said substrate.

7. The process defined in claim 4 wherein said substrate is silicon and said oxide is substantially silicon dioxide.

8. The process defined in claim 5 wherein said substrate is heated at a pressure of about one atmosphere for about five hours or more.

* * * * *